(12) United States Patent
Walliser

(10) Patent No.: US 9,054,439 B1
(45) Date of Patent: Jun. 9, 2015

(54) STRUCTURES FOR SEAMLESS COUPLING OF DEVICE MEMBERS

(71) Applicant: Amazon Technologies, Inc., Reno, NV (US)

(72) Inventor: Marc Rene Walliser, San Francisco, CA (US)

(73) Assignee: Amazon Technologies, Inc., Reno, NV (US)

( * ) Notice: Subject to any disclaimer, the term of this patent is extended or adjusted under 35 U.S.C. 154(b) by 205 days.

(21) Appl. No.: 13/768,613

(22) Filed: Feb. 15, 2013

(51) Int. Cl.
*H05K 5/00* (2006.01)
*H01R 13/502* (2006.01)
*H01R 43/20* (2006.01)
*H01R 13/74* (2006.01)

(52) U.S. Cl.
CPC .............. *H01R 13/502* (2013.01); *H01R 43/20* (2013.01); *H05K 5/0047* (2013.01); *H01R 13/748* (2013.01)

(58) Field of Classification Search
CPC ..... H05K 5/00; H05K 5/0047; H05K 5/0008; H01R 13/73; H01R 13/748
USPC ....................... 361/679.01; 439/544, 668, 489
See application file for complete search history.

(56) References Cited

U.S. PATENT DOCUMENTS

| 7,097,505 B1 * | 8/2006 | Shanahan et al. ........ 439/607.01 |
| 2007/0072488 A1 * | 3/2007 | Xue et al. ........................ 439/544 |

\* cited by examiner

*Primary Examiner* — Jayprakash N Gandhi
*Assistant Examiner* — Mandeep Buttar
(74) *Attorney, Agent, or Firm* — Sutherland Asbill & Brennan LLP

(57) ABSTRACT

Devices having embedded structural features that permit assembly of such devices in a manner that design efficiencies and packaging efficiencies can be accomplished satisfactorily and substantially without mutual exclusivity. In one aspect, structure(s) associated with a functionality of user equipment can be leveraged in order to couple a front housing of the user equipment with a rear housing thereof. In another aspect, leveraging such structure can permit assembly of the user equipment in a manner that provides a seamless appearance of the user equipment and mechanical reliability and/or versatility.

20 Claims, 8 Drawing Sheets

STRUCTURES FOR SEAMLESS COUPLING OF DEVICE MEMBERS

BACKGROUND

Techniques for assembly of consumer electronics, such as user equipment, typically emphasize either design efficiencies or packaging efficiencies. In general, design efficiencies—such as aesthetically pleasing appearance of assembled equipment—is accomplished at the expense of packaging efficiencies, such as serviceability of the assembled equipment.

BRIEF DESCRIPTION OF THE DRAWINGS

The accompanying drawings are an integral part of the disclosure and are incorporated into the subject specification. The drawings illustrate example embodiments of the disclosure and, in conjunction with the description and claims, serve to explain at least in part various principles, features, or aspects of the disclosure. Certain embodiments of the disclosure are described more fully below with reference to the accompanying drawings. However, various aspects of the disclosure can be implemented in many different forms and should not be construed as limited to the implementations set forth herein. Like numbers refer to like elements throughout.

DETAILED DESCRIPTION

Figure 1:
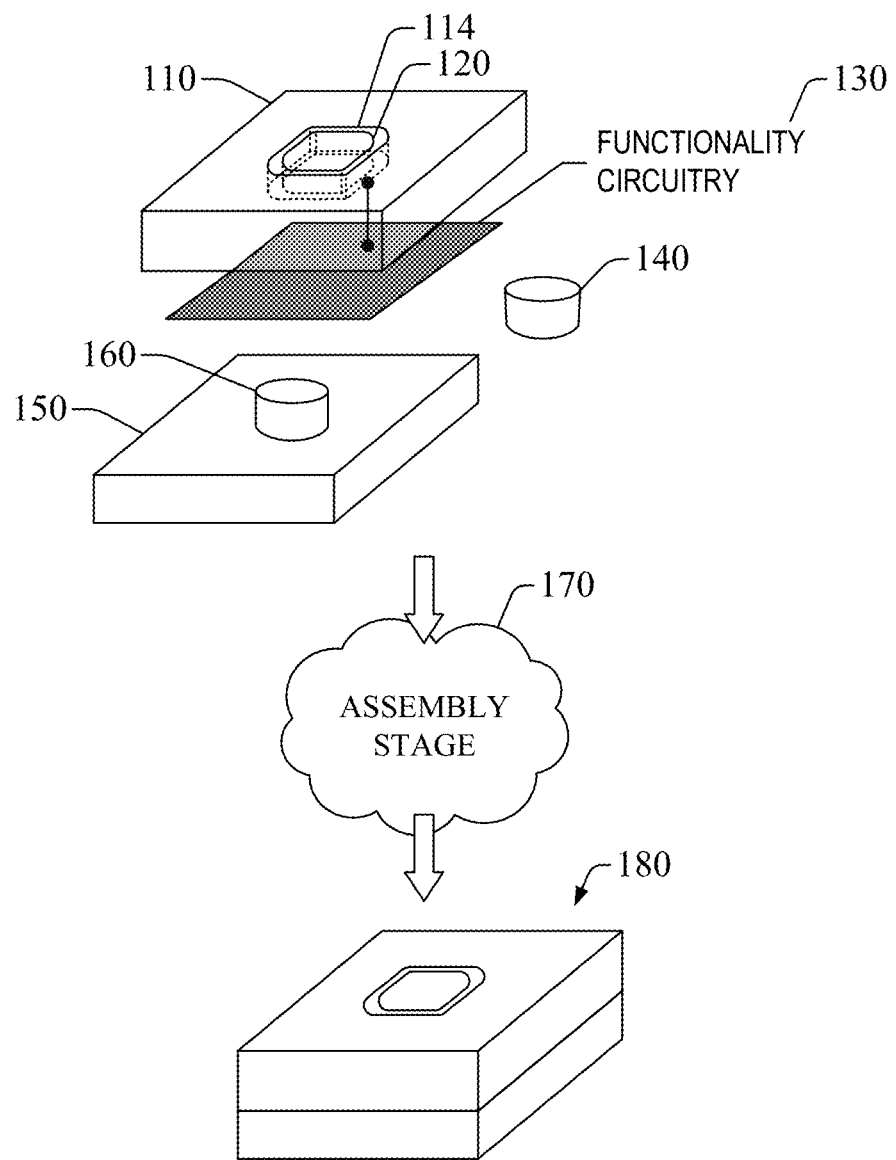
FIG. 1 illustrates example assembly of a device in accordance with one or more aspects of the disclosure.

The disclosure recognizes and addresses, in one aspect, the issue of mutual exclusivity among design efficiencies and packaging efficiencies that generally is present in assembly of consumer electronic devices. For example, assembly of a portable electronic device (or "portable device") can utilize an adhesive, a mechanical snap, and/or a screw to couple a rear housing of the portable device with the front housing thereof. While the mechanical snap and the use of adhesive can provide a clean aesthetic—which is a design efficiency that provides the appearance of sophistication—such coupling approach(es) tend to limit serviceability of the portable device after assembly thereof. In the alternative, the use of screw(s) generally may create a strong mechanical coupling, yet the screw(s) typically can be visible to a consumer with the ensuing appearance of unsophisticated design, which is a design deficiency.

As described in greater detail below, the disclosure provides devices (portable or otherwise) having embedded structural features that permit assembly of such devices in a manner that design efficiencies and packaging efficiencies can be accomplished satisfactorily and substantially without mutual exclusivity. To at least such end, in one aspect, the disclosure can leverage a structure associated with a functionality of user equipment, such as a portable electronic device (e.g., a mobile e-book reader or other type of mobile tablet, or a smartphone), in order to couple a front housing of the user equipment with a rear housing thereof. In one aspect, leveraging such structure can permit assembly of the user equipment (e.g., a mobile tablet) in a manner that provides uninterrupted or nearly uninterrupted appearance of the user equipment and mechanical reliability and/or versatility (e.g., cost-effective and/or non-destructive serviceability). In certain scenarios, the functionality can permit delivery or exchange of audio signals. In other scenarios, the functional functionality can comprise communication (e.g., transmission, reception, or exchange) of other information, such as content (e.g., video, audio), metadata, and/or signaling in analog format or digital format.

As an illustration, a device in accordance with an embodiment of the disclosure can comprise a first housing (e.g., a front housing) that defines an opening of the device. The opening can permit or facilitate access to the interior of the device. In addition, the opening can be defined, at least in part, by a structure or structural feature of the device that is associated with at least a portion of certain functionality of the device, such as exchange of audio signals and/or other content with another device. The opening can have a proximal end and a distal end, wherein the distal end can be located in the interior of the device. In certain embodiments, for example, the opening can be defined by an audio jack of the device. It should be appreciated that incorporation of an audio jack into most user equipment is part of extant manufacturing flows, and addition of a custom audio jack into a device can be part of specific development of user equipment. The device also can comprise a second housing (e.g., a rear housing) having a mounting element configured to couple the back housing to the front housing. Further, the device can comprise a coupling element that can attach the first housing to the second housing via at least the distal end of the opening and the mounting element. In one aspect, the coupling element can be configured to be coupled with the mounting element. As an example, the coupling element comprises one of a screw or a pin. It should be appreciated that, in one aspect, reliance on the coupling element for attachment of the front housing to the rear housing can provide mechanical stability to the device, and ease of disassembly and/or servicing of the device. In addition, as the coupling element is attached to the mounting element at the distal end of the opening, the coupling element (e.g., a screw or a pin) can be hidden from a consumer's view and, thus, the device can have an uninterrupted appearance, which is sought-after design efficiency.

Figure 2A:
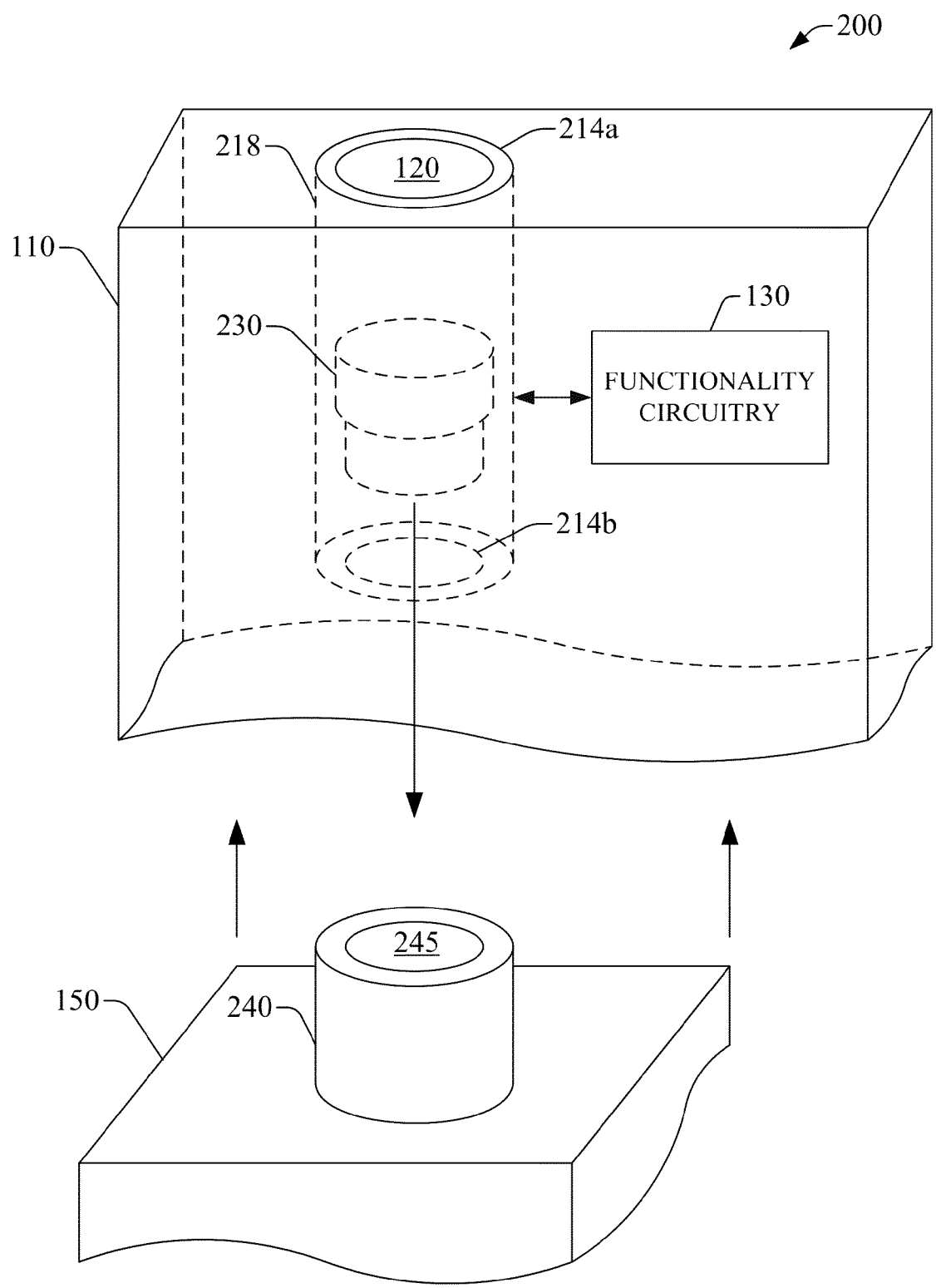
FIGS. 2A-2B illustrate example devices in accordance with one or more aspects of the disclosure.
Figure 2B:
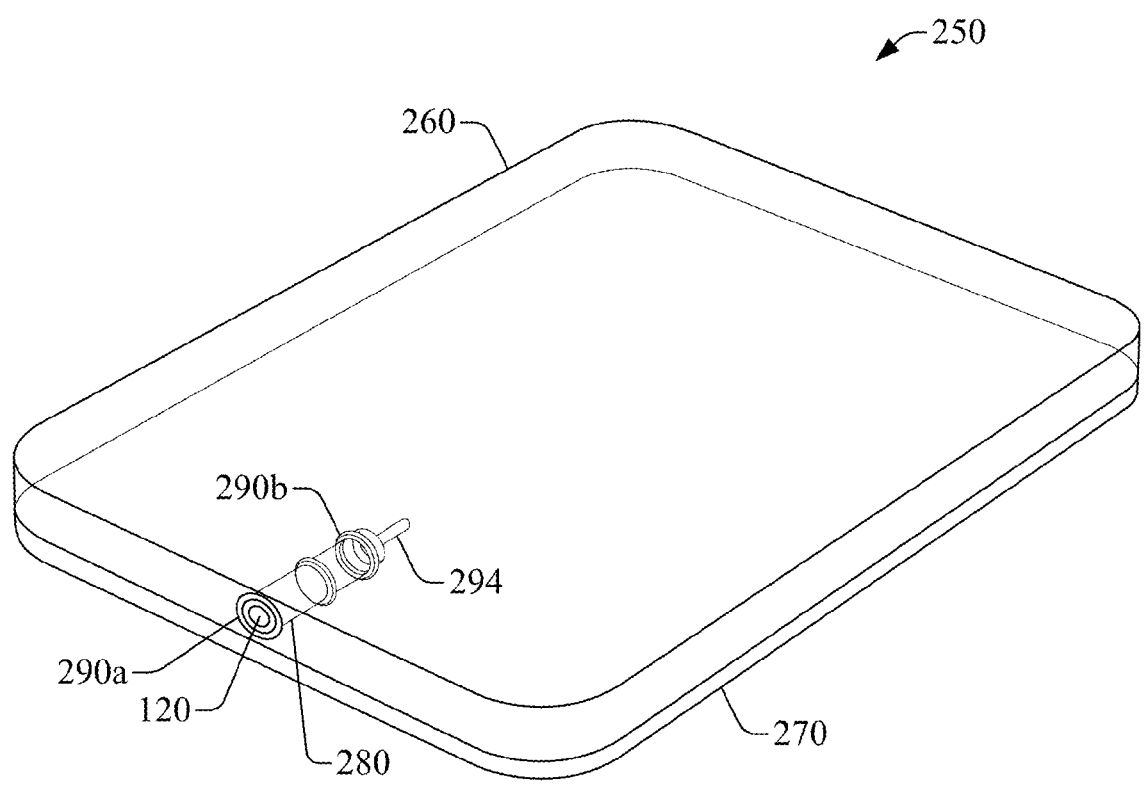

Referring to the drawings, FIG. 1 illustrates example assembly of a device in accordance with one or more aspects of the disclosure. Various features of such assembly are described in connection with FIGS. 2A-4D. The device can comprise a first member 110 (e.g., a front housing of a device 180, or a rear housing of the device 180) that can fit a hollow structure 114 that defines an opening 120 of the device 180. The opening 120 can permit access to the interior of the device and can have a proximal end and a distal end. The proximal end can be located in proximity of an external surface of the first member 110, whereas the distal end can be located within the interior of the device 180. As illustrated in FIGS. 2A-2B, the hollow structure 114 (e.g., a solid sleeve of circular section) can define the opening 120 can to have a circular section. The hollow structure can have specific structure, such as a sidewall 218 or sidewall 280. In certain embodiments, the hollow structure can be embodied in or can be contained in a through-hole female audio connector (also referred to as a through-hole audio jack). Similarly, the distal end (e.g., 214a or 290a) and the proximal end (e.g., 214b or 290b) can have a circular section. In one embodiment, e.g., embodiment 250, the first member 110 can embody or can comprise a front housing of the device 180. The front housing (front housing 260) and/or the rear housing (e.g., rear housing 270) can be formed from a rigid material, a flexible material, or a combination thereof.

The opening 120 can be defined, at least in part, by a structure of the device that can permit at least a portion of a functionality of the device (e.g., transmission of audio signal or other content). To at least such end, in one aspect, the opening 120 can be functionally coupled (e.g., electrically connected or magnetically coupled) to functionality circuitry 130 that provides at least a portion of the functionality. For example, in an embodiment in which the opening 120 is defined by a through-hole audio jack of the device 180, the functionality circuitry 130 can permit exchange of audio signals with another device (not shown in FIG. 1). In one aspect, such circuitry can be distributed and can comprise contact(s) of the audio jack assembly along the sidewall of such component. In one implementation of such embodiment, the structure that defines the opening 120 can have an internal diameter of about 3.5 mm. In addition or in the alternative, in such implementation, the structure that defines the opening 120 can have an external diameter of 5.0 mm. One such embodiment is illustrated in FIG. 2B, wherein an audio jack 280 (e.g., a through-hole audio jack) defines the opening 120, which has a proximal end 290a and a distal end 290b. It should be appreciated that the audio jack 280 can be a custom audio jack (see, e.g., FIGS. 4A and 4C-4D) that can permit insertion of a coupling element, e.g., an assembly screw 294, into the distal end 290b of the opening defined by the audio jack 280. In certain implementations, the audio jack 280 can be embodied in a 3.5 mm audio jack. For another example, in an embodiment in which the opening is defined by a network adapter (e.g., a universal serial bus (USB) connector), the functionality circuitry 130 can permit or otherwise facilitate communication of information (e.g., data, metadata, and/or signaling) in analog format or digital format. In an embodiment in which the opening is defined by a peripheral adapter (e.g., a battery-charger connector), the functionality circuitry 130 can permit communication (e.g., collection) of power signals (e.g., a voltage waveform or a current waveform) from a power supply. It should be appreciated that, in one aspect, the particular structure (e.g., sidewall(s) shape) that defines the opening 120 can be, at least in part, specific to the functionality of the device 180 and associated information exchange.

The device 180 also can comprise a second member 150 having a mounting element 160 configured to couple the second member 150 to the first member 110. As illustrated in FIG. 2A, the mounting element 160 can be embodied in a member 240 having a proximal end that is integrated or otherwise attached to the second member 150. In one aspect, the member 240 defines an opening 245 at or near a distal end of such member. In certain embodiments, the member 240 can be embodied in a pin, either hollow or solid (not shown) that is attached to a portion of the member 150, wherein such portion can be embodied in or can be contained in a flange. In certain embodiments, e.g., embodiment 250, the second member 150 can embody or can comprise a rear housing of the device 180 (such as rear housing 270) or a front housing of such device. It should be appreciated that, in a scenario in which the second member 150 is a front housing of the device 180, the first member 110 can be a front housing of such device.

Figure 3A:
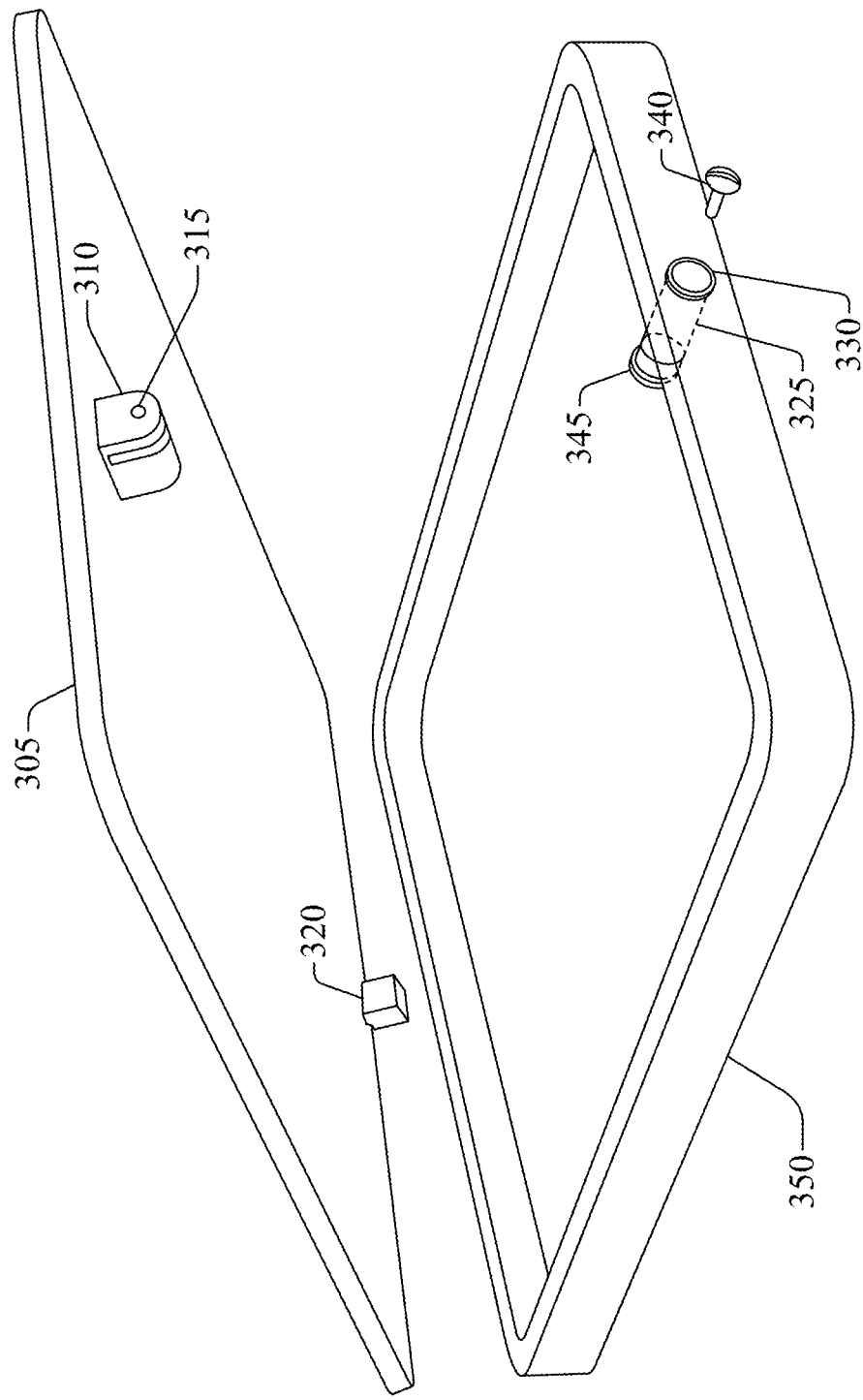
FIGS. 3A-3C illustrate another example device in accordance with one or more aspects of the disclosure.
Figure 4A:
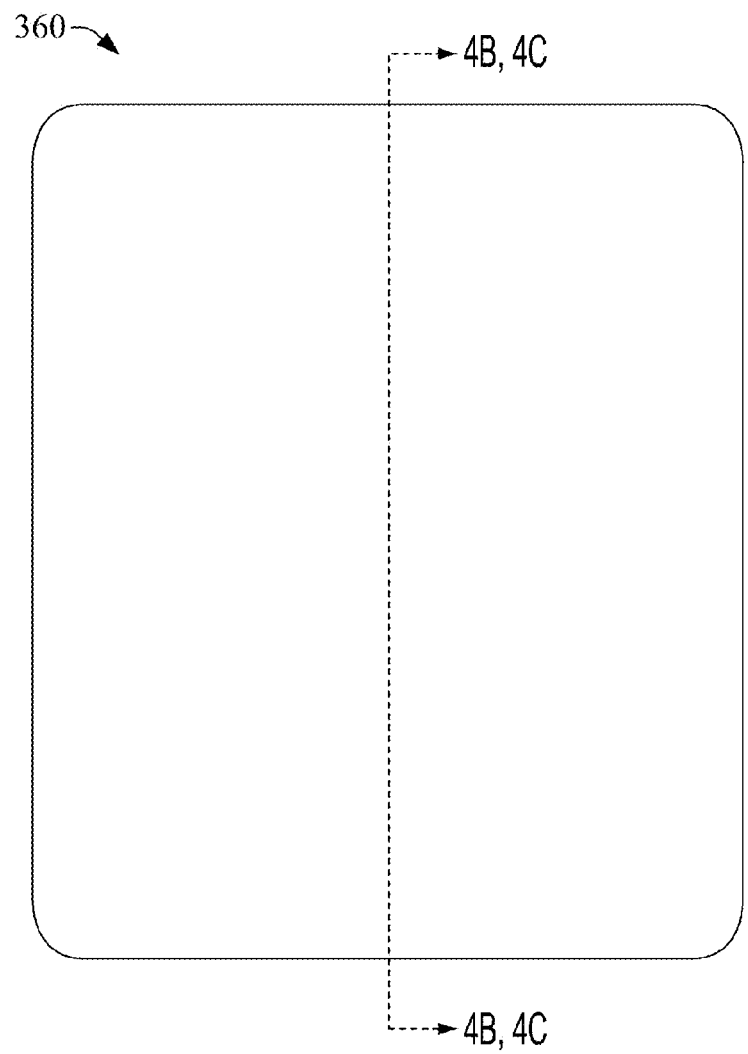
FIGS. 4A-4D illustrate structural features of the example device shown in FIGS. 3A-3C.
Figure 4B:
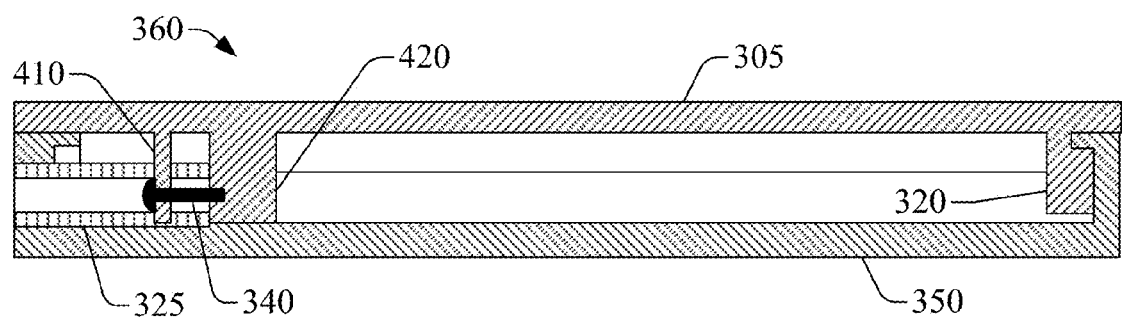
Figure 4C:
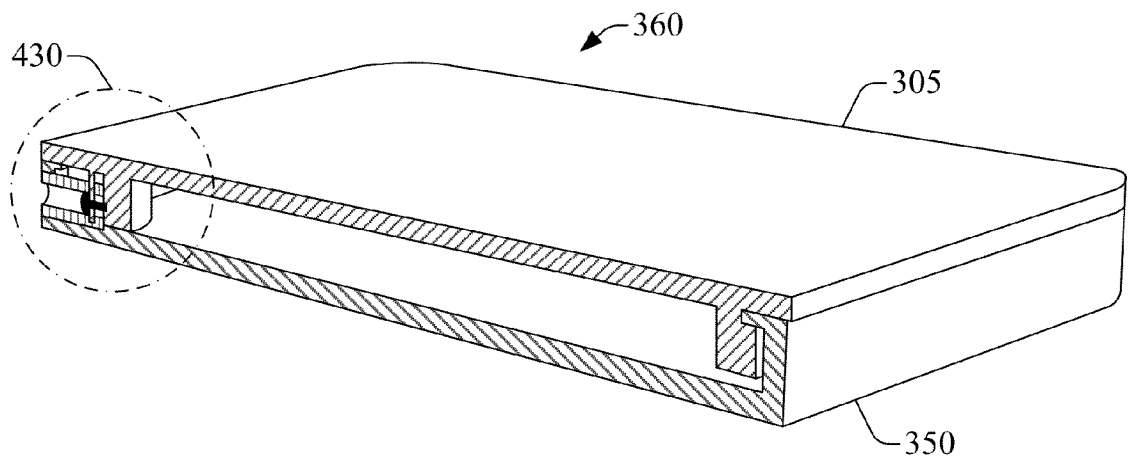
Figure 4D:
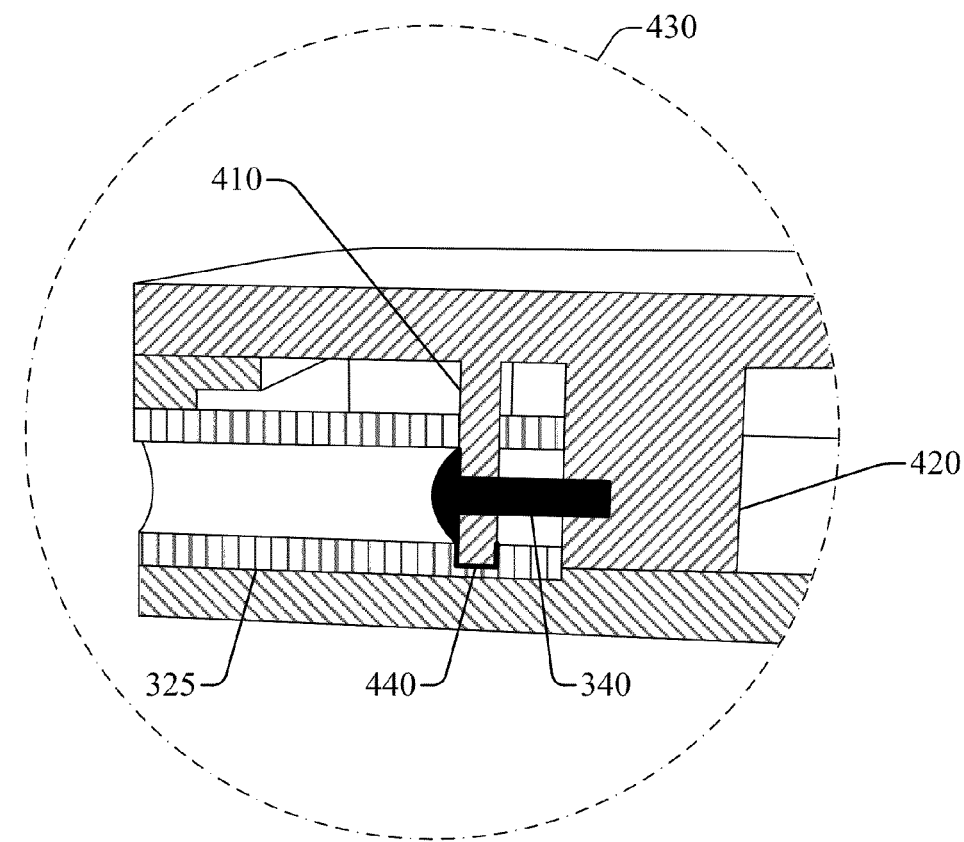

In certain embodiments, the mounting element 160 can be integrated or otherwise attached to the second member 150. In one aspect, the mounting element 160 can have a flange defining another opening, wherein the flange can be configured to couple to the through-hole audio jack that defines the opening 120. For example, in the example embodiment illustrated in FIG. 3A, a front housing 305 can have a mounting element 310 integrated therein. The mounting element 310 can define, in one aspect, an opening 315 and/or a slit—see also FIGS. 4B-4D. It should be appreciated that, in one aspect illustrated in FIG. 4B, the slit can be defined by integrating or otherwise forming (e.g., soldering, snapping, or the like) a flange 410 into the mounting element 310. Similarly, in one aspect also exemplified in FIGS. 4B-4D, a flange 420 contained in the mounting element 310 can define the opening 315. As described herein, the structure (e.g., shape and/or size) of the mounting element 160 can be specific to structure associated (e.g., that defines) the distal end of the opening 120. For example, as illustrated in FIG. 3A, a rear housing 350 can define an opening 330 via a structure 325 (e.g., sidewall(s)) having a distal end 345. It should be appreciated that, in one aspect, the distal end 345 defines the distal end of the opening 330. In certain embodiment, the structure 325 can be embodied in a through-hole audio jack that is fitted or otherwise embedded into an opening of the rear housing 350. As depicted in FIGS. 4B-4D, a cross-section of device 360, as assembled according to one or more aspects described herein, illustrates an example structure of the distal end 345 that is configured to mount (e.g., assemble rigidly or stably) such structure onto the mounting element 310. As further illustrIn another aspect, also illustrated in FIG. 4B, the structure of the mounting element 160 and the structure of the distal end of the opening 120 can be configured for a coupling element 140 or any mechanical connection to be assembled within the device 180 in a manner that the coupling element 140 can attach the first member 110 to the second member 150 via at least the distal end of the opening 120 and the mounting element 160. The coupling element 140 can fit into the opening 120. As an illustration, in one embodiment, the coupling element 140 can fit into the through-hole audio jack that defines the opening 120 and can attach the first member 110 (e.g., a front housing) to the second member 150 (e.g., a rear housing) via at least the distal end of the opening and a flange integrated or otherwise contained into the mounting element 160. The flange, as described herein, can define another opening configured to couple the first member 110 to the second member 150. In one aspect, the through-hole audio jack can have a slit that fits at least a portion of the flange and thus permits, at least in part, such coupling.

Figure 3B:
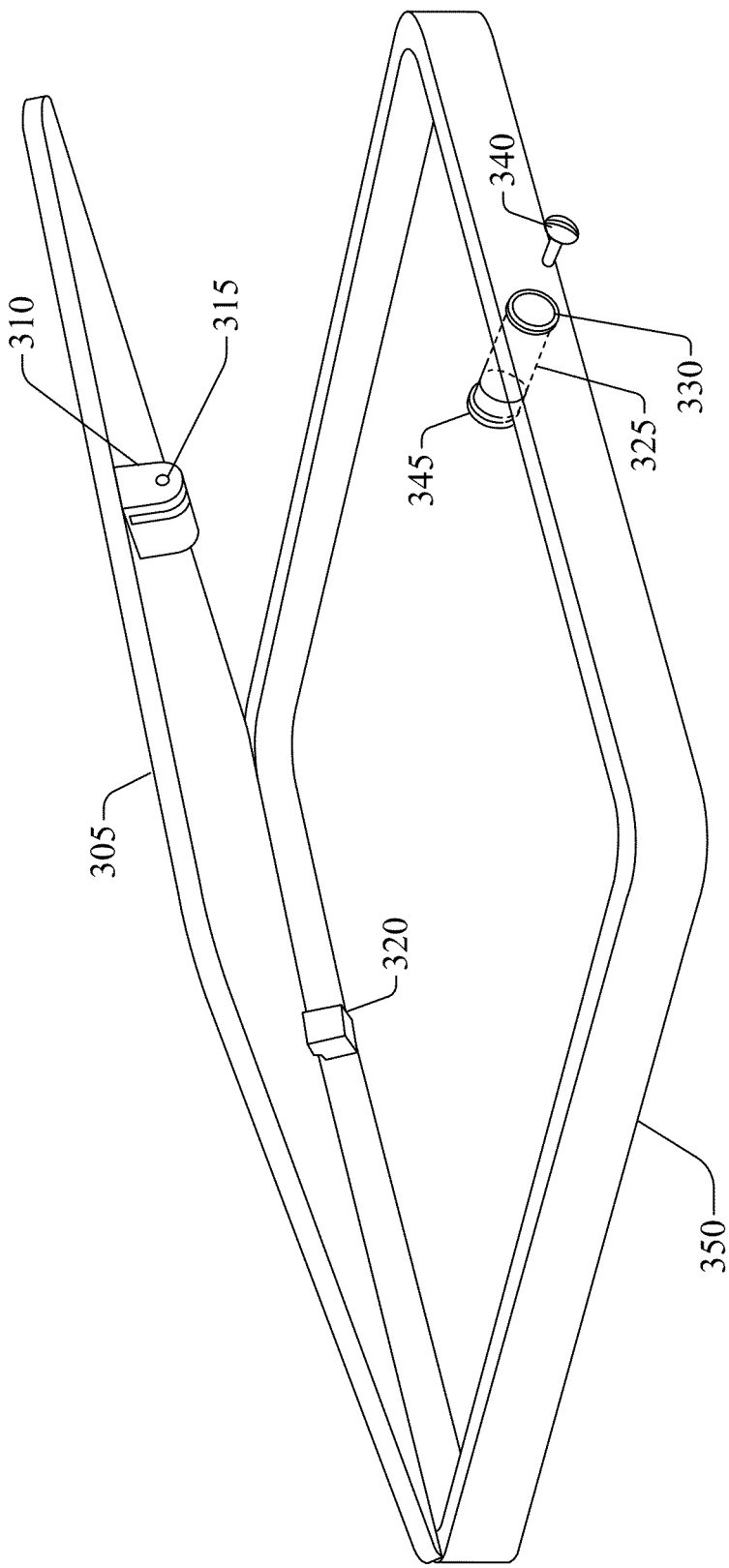
Figure 3C:
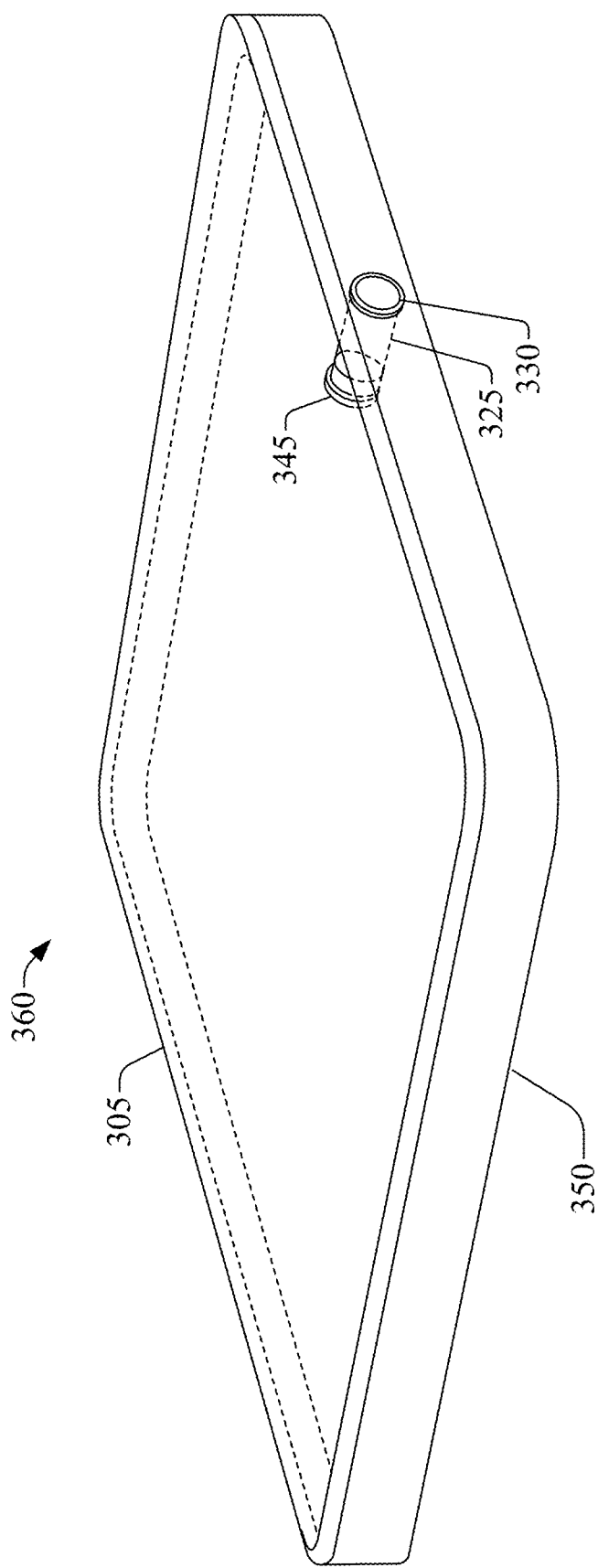

Such attachment is part of the disclosed assembly technique and includes suitable movement(s) (represented with arrows in FIG. 2A) of the first member 110 towards the second member 150, or vice versa, and insertion of the coupling element 230 into the opening 120 and attachment or mechanical connection of such element with the mounting element 160, which can be embodied in the member 240. In certain embodiments, as illustrated in FIGS. 3A-3C, assembly of the device in accordance with one or more described aspects can comprise a sequence of movements. For example, as illustrated in FIG. 3A, a front housing 305 is coupled to the rear housing 350 via a member 320. Such member can be suitably formed to provide stable attachment (e.g., through a snap mechanism) to the rear housing 350. Subsequently, as illustrated in FIG. 3B, the partially assembled front housing 305 is moved towards the distal end 345 of the structure 325 that defines the opening 330. As described herein, the front housing 305 comprises a mounting element 310 that is configured to be coupled to specific structure of the distal end 345. After the mounting element 310 and the distal end 345 or structure thereof are coupled, a screw 340 can be inserted through the opening 330 and screwed into the mounting element 310 in order to attach the front housing 305 to the rear housing 350. The front housing 305 also includes a mounting element 320 that also permits mounting or otherwise mounting the front housing 305 to the rear housing 350.

As an illustration of the described attachment, in FIG. 4B, a screw 340 (shown as a black silhouette) can embody the coupling element 140 and can be screwed, for instance, into the flange structure (or flange) of the mounting element 310 via the distal end 345. In one aspect, the flange structure can have threads that permit screwing displacement and fastening action of the screw 340. In another aspect, which is illustrated in detail 430 in FIG. 4D, the structure 325 can define a slit 440 (pictorially emphasized with a thick line, for clarity) that permits or facilitates mounting of the mounting element 310. It is noted that while the structure 325 is illustrated as a section of a sleeve or hollow cylinder having a specific thickness, the morphology of the structure 325 can be based at least in part on the device's functionality associated therewith. FIGS. 4B-4D also illustrate coupling of the front housing 305 and rear housing 350 via the mounting element 320.

The coupling element 140 can comprise one or more of a screw, a pin, or the like. In one scenario, the mounting element 160 can comprise a flange having a pin, and the coupling element 140 can attach the flange to the first member 110 at the distal end of the opening 120. In another scenario, as described herein, the mounting element 160 can comprise a flange or structural feature defining another opening, such as a slit (see, e.g., FIG. 2A, FIG. 3A, and/or FIG. 4B), and the coupling element 140 can attach the flange to the first member at the distal end of the opening 120.

As described herein, it should be appreciated that attachment of the first member 110 to the second member 150 through the distal end of the opening 120, via the coupling element 140, can result in an uninterrupted view of the device 180. In one aspect, the uninterrupted view of the device 180 prevents view or perception of the coupling element 140, that is, the visible features of the device 180 do not include coupling components. It should further be appreciated that, in another aspect, the coupling element 140 is accessible through the opening 120 (e.g., the coupling element 140 fits into the opening 120). Such access can permit straightforward servicing of the device 180 by permitting removal of the coupling element 140 and ensuing detachment of the first member 110 and the second member 150.

While in certain embodiments the functionality can be associated with structure that defines an opening at a specific member (e.g., a device housing, an audio jack, or the like), the disclosure also contemplates scenarios in which the opening associated with the structure can be defined partially by two or more members to be assembled. In an embodiment in which a front housing and a rear housing are to be assembled according to one or more aspects of the disclosure, a first portion of an opening can be defined by the front housing, and a second portion of the opening can be defined by the rear housing. As described herein, such opening can be defined or otherwise related to structure that permit, at least in part, certain functionality of user equipment having the rear and front housings.

The described assembly of the first member 110, the second member 150, and the coupling element 140 can be accomplished in an assembly stage 170 (or construction flow, as referred to in certain embodiments). In view of at least the aspects described herein, in certain embodiments, the assembly state 170 can include an example method for assembling devices. The method can comprise providing a first housing (e.g., a rear housing) defining a first opening (e.g., opening 120). As described herein, the first opening permits access to the interior of a device (e.g., device 180 or device 250). In addition, the example method can comprise providing a hollow structure (e.g., structure 325) that fits into the first opening of the device. In certain implementations of the example method, providing the hollow structure that fits into the first opening of the device comprises providing a through-hole audio jack having an internal diameter of about 3.5 mm and/or an external diameter of about 5.0 mm. For instance, the hollow structure can include a structural member (e.g., a conducting sidewall, a hollow solid sleeve with a specific thickness, or the like) defining an orifice that has a diameter of about 3.5 mm and having a thickness of about 1.5 mm. The structural member can permit, at least in part, certain functionality of the device. In one embodiment, the structural member can be embodied in or can be contained in an audio jack of the device. The hollow structure can have a proximal end (e.g., 290a) and a distal end (e.g., 290b). As described herein, the functionality associated with the structural member can include communication functionality that permits or otherwise facilitates communication of information (e.g., data, metadata, and/or signaling) in one or more of analog format or digital format.

In addition or in the alternative, the example method can comprise providing a second housing (e.g., a front housing 270) defining a second opening (e.g., opening 245) configured to couple the first housing to the second housing at the distal end of the first opening. In one aspect, providing the second housing defining the second opening configured to couple the first housing to the second housing at the distal end of the first opening comprises providing at least one flange defining at least one respective other opening, where the flange can be configured to couple to the through-hole audio jack that embodies or contains the hollow structure. Moreover or as an alternative, the example method can comprise attaching the first housing to the second housing with a coupling element (e.g., coupling element 230, such as an assembly screw or assembly pin) via at least the distal end of the first opening and the second opening. It should be appreciated that attaching the front housing to the rear housing in the manner described herein can hide the coupling element from a consumer's view and an uninterrupted appearance can be provided to the assembly. In one implementation (such as one that may include the example sequence shown in FIGS. 3A-3C), attaching the first housing to the second housing can comprise screwing the coupling element into the distal end of the first opening and the second opening. In another implementation, attaching the first housing to the second housing can comprise pushing the coupling element through the distal end of the first opening into the second opening—see, as an illustration, FIG. 2A.

Various example advantages over conventional techniques for assembly of consumer electronics, such as user equipment, emerge from the description herein and annexed drawings. One example advantage may be that the disclosed assembly technique (e.g., members, and/or coupling elements or fasteners) can permit or facilitate more sophisticated appearance of device or "cleaner" aesthetics. The more sophisticated appearance is a design efficiency that can lead to better design. Another example advantage may be improved mechanical structure and ensuing mechanical stability as a result of the assembly of a coupling element into robust structure(s). Improved mechanical structure can yield better reliability of mechanical properties of a device. Yet another example advantage may be improved serviceability as a result of disassembly ease afforded at least in part by the opening through which the coupling element can be accessed.

Unless otherwise expressly stated, it is in no way intended that any protocol, procedure, process, or method set forth herein be construed as requiring that its acts or steps be performed in a specific order. Accordingly, where a process or method claim does not actually recite an order to be followed by its acts or steps or it is not otherwise specifically recited in the claims or descriptions of the subject disclosure that the steps are to be limited to a specific order, it is in no way intended that an order be inferred, in any respect. This holds for any possible non-express basis for interpretation, including: matters of logic with respect to arrangement of steps or operational flow; plain meaning derived from grammatical organization or punctuation; the number or type of embodiments described in the specification or annexed drawings, or the like.

Conditional language, such as, among others, "can," "could," "might," or "may," unless specifically stated otherwise, or otherwise understood within the context as used, is generally intended to convey that certain implementations could include, while other implementations do not include, certain features, elements, and/or operations. Thus, such conditional language generally is not intended to imply that features, elements, and/or operations are in any way required for one or more implementations or that one or more implementations necessarily include logic for deciding, with or without user input or prompting, whether these features, elements, and/or operations are included or are to be performed in any particular implementation.

What has been described herein in the present specification and annexed drawings includes examples of assembly techniques (e.g., assemblies, devices, process(es), combination thereof, and the like) that can provide assembly of a device (such as a portable electronic device) in a manner that design efficiencies and packaging efficiencies can be accomplished satisfactorily and substantially without mutual exclusivity. It is, of course, not possible to describe every conceivable combination of elements and/or methodologies for purposes of describing the various features of the disclosure, but one of ordinary skill in the art can recognize that many further combinations and permutations of the claimed subject matter are possible. Accordingly, it may be apparent that various modifications can be made to the disclosure without departing from the scope or spirit thereof. In addition or in the alternative, other embodiments of the disclosure may be apparent from consideration of the specification and annexed drawings, and practice of the disclosure as presented herein. It is intended that the examples put forward in the specification and annexed drawings be considered, in all respects, as illustrative and not restrictive. Although specific terms are employed herein, they are used in a generic and descriptive sense only and not for purposes of limitation.

What is claimed is:

1. A device, comprising:
   a front housing that defines an opening of the device;
   a through-hole audio jack that fits into the opening of the device and has a proximal end and a distal end;
   a rear housing that has a flange defining another opening, wherein the flange is configured to couple to the through-hole audio jack; and
   a coupling element that fits into the through-hole audio jack and attaches the front housing to the rear housing via at least the distal end of the opening and the flange.

2. The device of claim 1, wherein the through-hole audio jack has an internal diameter of about 3.5 mm.

3. The device of claim 1, wherein the through-hole audio jack has an external diameter of about 5.0 mm.

4. The device of claim 1, wherein the through-hole audio jack has an internal diameter of about 3.5 mm and an external diameter of about 5.0 mm.

5. The device of claim 1, wherein the through-hole audio jack has a slit that fits at least a portion of the flange.

6. The device of claim 1, wherein the coupling element comprises one of a screw or a pin.

7. A device, comprising:
   a first member having a hollow structure that defines an opening of the device, the hollow structure is configured to connect to a component that provides functionality of the device, and the opening has a proximal end and a distal end, wherein the hollow structure is contained in an audio jack of the device;
   a second member having a mounting element configured to couple the second member to the first member; and
   a coupling element that fits into the hollow structure and attaches the first member to the second member via the mounting element.

8. The device of claim 7, wherein the hollow structure has an internal diameter of about 3.5 mm.

9. The device of claim 7, wherein the hollow structure has an internal diameter of about 3.5 mm and an external diameter of about 5.0 mm.

10. The device of claim 7, wherein the mounting element comprises a flange defining another opening, and the coupling element attaches the flange to the first member at the distal end of the first opening.

11. The device of claim 7, wherein the mounting element comprises a flange having a pin, and the coupling element attaches the flange to the first member at the distal end of the first opening.

12. The device of claim 7, wherein the coupling element comprises one of a screw or a pin.

13. The device of claim 7, wherein the coupling element is accessible through the opening.

14. The device of claim 7, wherein the first member comprises a front housing of the device.

15. The device of claim 14, wherein the second member comprises a rear housing of the device.

16. A method for assembling devices, comprising:
   providing a first housing defining a first opening of a device;
   providing a hollow structure that fits into the first opening of the device and has a proximal end and a distal end, wherein the hollow structure is contained in an audio jack of the device;
   providing a second housing defining a second opening configured to couple the first housing to the second housing at the distal end of the first opening; and
   attaching the first housing to the second housing with a coupling element via at least the distal end of the first opening and the second opening.

17. The method of claim 16, wherein the audio jack comprises a through-hole audio jack having an internal diameter of about 3.5 mm and an external diameter of about 5.0 mm.

18. The method of claim 17, wherein providing the second housing defining the second opening configured to couple the first housing to the second housing at the distal end of the first opening comprises providing at least one flange defining at least one respective other opening, wherein the flange is configured to couple to the through-hole audio jack.

19. The method of claim 16, wherein attaching the first housing to the second housing comprises screwing the coupling element into the distal end of the first opening and the second opening.

20. The method of claim 16, wherein attaching the first housing to the second housing comprises pushing the coupling element through the distal end of the first opening into the second opening.

* * * * *